United States Patent
Kokotov et al.

(10) Patent No.: US 8,283,555 B2
(45) Date of Patent: Oct. 9, 2012

(54) PHOTOVOLTAIC SOLAR POWER GENERATION SYSTEM WITH SEALED EVAPORATIVE COOLING

(75) Inventors: Yuri Kokotov, Jerusalem (IL); Michael A. Reyz, Rockville, MD (US); Joseph Fisher, Jerusalem (IL)

(73) Assignee: Solaris Synergy Ltd., Jerusalem (IL)

( * ) Notice: Subject to any disclaimer, the term of this patent is extended or adjusted under 35 U.S.C. 154(b) by 0 days.

(21) Appl. No.: 13/056,197

(22) PCT Filed: Jun. 23, 2009

(86) PCT No.: PCT/US2009/048279
§ 371 (c)(1),
(2), (4) Date: Jan. 27, 2011

(87) PCT Pub. No.: WO2010/014310
PCT Pub. Date: Feb. 4, 2010

(65) Prior Publication Data
US 2011/0126885 A1    Jun. 2, 2011

Related U.S. Application Data

(60) Provisional application No. 61/084,630, filed on Jul. 30, 2008.

(51) Int. Cl.
*H01L 31/024* (2006.01)
(52) U.S. Cl. ........ 136/246; 136/259; 136/244; 136/253; 136/247; 257/433; 257/434; 257/436
(58) Field of Classification Search .................. 136/243, 136/244, 251, 259; 438/64
See application file for complete search history.

(56) References Cited

U.S. PATENT DOCUMENTS 4,214,572 A    7/1980  Gonder
4,217,147 A *  8/1980  Ziemba ......................... 136/248
(Continued)

FOREIGN PATENT DOCUMENTS
DE    10150176 A1    4/2003
(Continued)

OTHER PUBLICATIONS

Online Dictiionary, definition of exposed, http://www.thefreedictionary.com, downloaded Dec. 6, 2011.*
(Continued)

*Primary Examiner* — Jennifer Michener
*Assistant Examiner* — Jayne Mershon
(74) *Attorney, Agent, or Firm* — Rathe Lindenbaum LLP (57) ABSTRACT

A solar power generation system includes a plurality of individual modules, each formed from a photovoltaic cell, a solar concentrator, a sealed evaporative cooling system and a heat sink. The solar concentrator focuses sunlight onto a front side the cell to generate electricity. The cooling system circulates a coolant in a liquid state to an evaporative cooling chamber having a wall defined at least partially by a back side of the cell to remove heat from the cell by direct contact between the coolant and the cell, and emits coolant in a vapor state to a condenser where the vapor coolant is condensed to a liquid state. The heat sink may be any suitable body of water, such that the condenser may be at least partially submerged therein. The modules are combined to form a platform that is rotated on the body of water by a drive device to provide tracking of the sun.

20 Claims, 7 Drawing Sheets

U.S. PATENT DOCUMENTS

| | | | |
|---|---|---|---|
| 4,249,516 A | 2/1981 | Stark | |
| 4,299,200 A | 11/1981 | Spencer | |
| 4,315,500 A | 2/1982 | Gonder | |
| 4,350,143 A | 9/1982 | Laing et al. | |
| 4,361,717 A | 11/1982 | Gilmore et al. | |
| 4,481,788 A * | 11/1984 | Yoshino | 62/181 |
| 4,606,794 A | 8/1986 | Wyckoff | |
| 4,771,764 A | 9/1988 | Cluff | |
| 5,445,177 A | 8/1995 | Laing et al. | |
| 5,772,791 A | 6/1998 | Laing | |
| 6,080,927 A * | 6/2000 | Johnson | 136/248 |
| 6,118,067 A | 9/2000 | Lashley et al. | |
| 7,299,632 B2 | 11/2007 | Laing et al. | |
| 2002/0017380 A1* | 2/2002 | Jonsson et al. | 165/104.12 |
| 2006/0048810 A1* | 3/2006 | Laing et al. | 136/246 |
| 2007/0039642 A1* | 2/2007 | Lasich | 136/243 |
| 2007/0166573 A1* | 7/2007 | Wu et al. | 429/9 |
| 2008/0015604 A1 | 1/2008 | Collazo | |
| 2008/0142078 A1* | 6/2008 | Johnson | 136/259 |
| 2008/0148758 A1* | 6/2008 | Kidwell et al. | 62/260 |
| 2008/0164135 A1* | 7/2008 | Slook | 202/83 |
| 2008/0210292 A1* | 9/2008 | Urli | 136/246 |
| 2008/0257398 A1* | 10/2008 | Laing et al. | 136/246 |
| 2009/0277494 A1* | 11/2009 | Mazzer et al. | 136/246 |

FOREIGN PATENT DOCUMENTS

| | | |
|---|---|---|
| DE | 10214408 A1 | 10/2003 |
| JP | 2006-317128 * | 11/2006 |
| WO | WO 2008/015604 A2 | 2/2008 |

OTHER PUBLICATIONS

Kurtz, Current status of the concentrating photovoltaic power industry, Photovoltaics International, Aug. 2008, pp. 121-125, USA.

Kurtz, Opportunities and Challenges for Development of a Mature Concentrating Photovoltaic Power Industry, Technical Report NREL/TP-520-43208, National Renewable Energy Laboratory, Revised Sep. 2008, 23 pages, available electronically at http://www.osti.gov/bridge, USA.

International Search Report and Written Opinion for International Application No. PCT/US2009/048279, mail date Aug. 18, 2009, 4 pages.

* cited by examiner

PHOTOVOLTAIC SOLAR POWER GENERATION SYSTEM WITH SEALED EVAPORATIVE COOLING

CROSS REFERENCE TO RELATED APPLICATIONS

The present Application claims the benefit of International Application No. PCT/US2009/048279, titled "Photovoltaic Solar Energy Generation System" filed Jun. 23, 2009, which claims the benefit of priority of U.S. Provisional Patent Application No. 61/084,630, titled "Photovoltaic Solar Energy Concentrator and a Solar Power System Incorporating Same" filed on Jul. 30, 2008, the entire disclosures of which are incorporated by reference herein.

FIELD

The present invention relates to solar energy conversion into a usable form of energy, and, more specifically, to a solar power module with a sealed evaporative cooling system built around a photovoltaic cell and to a photovoltaic solar power generation system incorporating such solar power module with the sealed evaporative cooling system.

BACKGROUND

This section is intended to provide a background or context to the invention recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

It would be desirable to provide an improved solar power generation system that uses a solar concentrator(s) to focus sunlight on photovoltaic cell(s) to generate electricity. However, the problems posed by this type of arrangement are complex because the heat generated within the photovoltaic cell can reach levels that may damage the cell. For example, the amount of power consumed by conventional equipment and technologies for cooling the cell(s) typically reduce the overall electrical generation efficiency of such cells to an undesirable level. Further complicating the use of conventional cooling technologies is the number of moving parts typically required that tend to cause reduced reliability, and increased maintenance, downtime and expense.

Accordingly, it would be desirable to provide a solar power generation system formed from a plurality of individual solar power modules having a solar concentrator focusing sunlight onto one or more photovoltaic cells that interface with a sealed evaporative cooling system to provide contact cooling of the cell with a coolant.

SUMMARY

According to one aspect of the invention, a photovoltaic solar power generation system includes at least one photovoltaic cell having a first side and a second side, a solar concentrator configured to focus solar radiation on the first side of the photovoltaic cell, and a sealed evaporative cooling system, comprising an evaporative cooling chamber defined at least partially by the second side of the photovoltaic cell, the cooling chamber containing a coolant.

In an aspect of one embodiment, the chamber is defined at least partially by the second side of the photovoltaic cell, and the sealed evaporative cooling system further comprises a condenser operable to receive the coolant in a vapor state and condense the coolant to a liquid state, and at least one coolant supply line configured to direct the coolant in the liquid state from the condenser to the evaporative cooling chamber.

In another aspect of one embodiment, the sealed evaporative cooling system further comprises at least one coolant return line configured to direct the coolant from the evaporative cooling chamber to the condenser.

In yet another aspect of one embodiment, a coolant conveyance device is configured to convey the coolant in a liquid state from the condenser to the evaporative cooling chamber, and wherein the coolant conveyance device comprises a makeup fluid conveyance device.

In still another aspect of one embodiment the at least one coolant return line comprises an overflow coolant return line and a vapor coolant return line; the overflow coolant return line communicating with the evaporative cooling chamber at a first elevation to define a maximum liquid coolant level within the evaporative cooling chamber, and the vapor coolant return line communicating with the evaporative cooling chamber at a second elevation that is higher than the first elevation.

In yet another aspect of one embodiment, the evaporative cooling chamber comprises a first liquid coolant region and a first vapor coolant region, and the condenser comprises a second liquid coolant region and a second vapor coolant region, and the vapor coolant return line has a cross-sectional area sized to maintain a substantially uniform vapor pressure in the first and second vapor coolant regions.

In another aspect of one embodiment, the condenser comprises a plastic conduit that is configured to transfer heat from the coolant to a body of water.

In another aspect of one embodiment, the conduit comprises a corrugated wall.

In still another aspect of one embodiment, the condenser is configured to be at least partially submerged in the body of water.

In yet another aspect of one embodiment, a partial pressure of air within the evaporative cooling system is less than a partial pressure of the coolant vapor.

In another aspect of one embodiment, the coolant comprises water.

In another aspect of one embodiment, wherein the photovoltaic cell comprises at least one electrode, the electrode exposed to the coolant in the liquid state in an interior space of the evaporative cooling chamber.

In another aspect of one embodiment, the photovoltaic cell and the solar concentrator are operably coupled to a platform.

In another aspect of one embodiment, the solar concentrator and the photovoltaic cell and the sealed evaporative cooling system are included in a module, and further comprising a plurality of modules disposed on the platform.

In another aspect of one embodiment a drive device is configured to rotate the platform.

According to another aspect of the invention, a solar power generation system includes a plurality of solar power modules. Each module including at least one photovoltaic cell having a first side and a second side, and a solar concentrator configured to focus solar radiation on the first side of the photovoltaic cell, and a sealed evaporative cooling assembly configured to circulate a coolant. The assembly includes an evaporative cooling chamber having one or more walls, with at least one wall defined at least partially by the second side of the photovoltaic cell, and a condenser, and at least one coolant supply line configured to direct the coolant from the condenser to the evaporative cooling chamber, and at least one coolant return line configured to direct the coolant from the evaporative cooling chamber to the condenser. The system also includes a platform having the plurality of solar power modules, and a drive device configured to rotate the platform.

According to a further aspect of the invention, a solar power generation system includes a condenser operable to receive a coolant in a vapor phase and condense the coolant to a liquid phase, and a plurality of solar power modules that each include at least one photovoltaic cell having a first side and a second side, a solar concentrator configured to focus solar radiation on the first side of the photovoltaic cell, and an evaporative chamber coupled to the photovoltaic cell proximate the second side, the evaporative chamber configured to receive the coolant in the liquid phase to remove heat from the photovoltaic cell.

According to yet another aspect of the invention, a solar power generation system includes a plurality of photovoltaic cells, each of the cells having a first side and a second side, and at least one solar concentrator configured to focus solar radiation on the first side of the photovoltaic cell, and a sealed evaporative cooling system. The cooling system includes an evaporative cooling chamber containing a coolant and having one or more walls, at least one wall defined at least partially by the second side of the photovoltaic cell, a condenser, at least one coolant supply line configured to direct the coolant in a liquid state from the condenser to the evaporative cooling chamber, and at least one coolant return line configured to direct the coolant in a vapor state from the evaporative cooling chamber to the condenser.

DETAILED DESCRIPTION

Referring to the FIGURES, a solar power generation system is provided that includes a plurality of individual solar power modules, each formed from a photovoltaic cell (or a plurality of photovoltaic cells), a solar concentrator, a sealed evaporative cooling system, and a shared heat sink. The solar concentrator focuses sunlight onto a front side (i.e. light receiving side) of the photovoltaic cell to generate electricity. The sealed evaporative cooling system circulates a coolant in a liquid state to an evaporative cooling chamber having a wall or other portion defined by a back side of the photovoltaic cell (or otherwise being in a heat-removal relationship with the cell) to remove heat from the cell at least partially by direct contact between the coolant and the cell, and emits coolant in a vapor state from the chamber to a condenser where the vapor coolant is condensed to a liquid state. The heat sink may be any suitable body of water, such that the condenser may be at least partially submerged therein. The modules are combined (in a number dictated by the desired capacity of the solar power generation system) to form a platform that is rotated on the body of water by a drive device to provide tracking of the modules relative to movement of the sun. According to another embodiment, the evaporative cooling chamber and the condenser can be combined into a phase transition chamber where a portion of the phase transition chamber is used as an evaporator, and another portion of the phase transition chamber is used as a condenser.

Figures 1, 2, 3, 4:
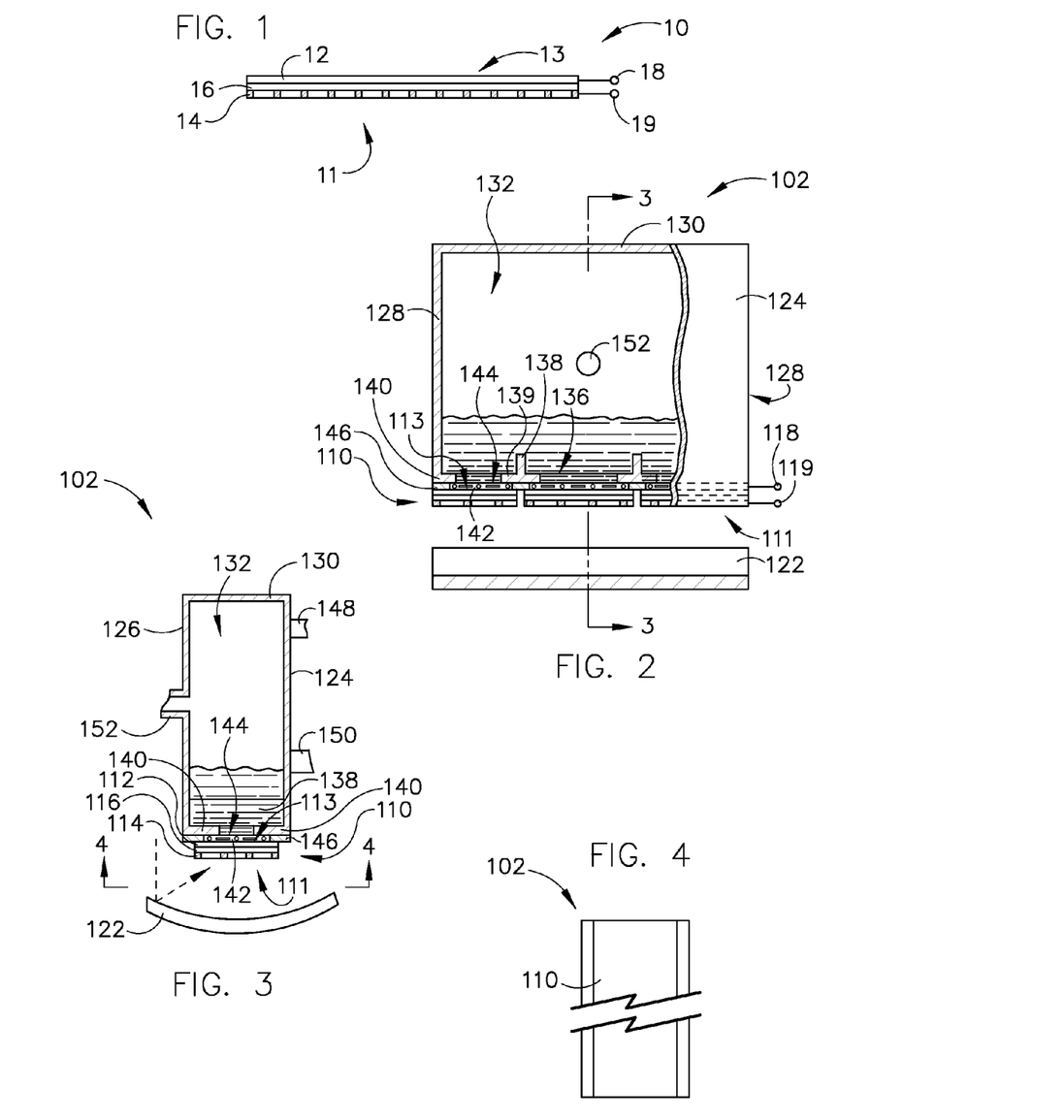
FIG. 1 is a schematic cross sectional image of a photovoltaic cell for use in a solar power generation system according to an exemplary embodiment.
FIG. 2 is a schematic partial cross sectional image of a photovoltaic solar power unit, and a photovoltaic cell for a solar power generation system according to an exemplary embodiment.
FIG. 3 is a schematic cross sectional image along the line 3-3 of FIG. 2 according to an exemplary embodiment.
FIG. 4 is a schematic cross sectional image along the line 4-4 of FIG. 3 according to an exemplary embodiment.

Referring to FIG. 1, a photovoltaic cell 10 is shown for use in a photovoltaic solar power generation system according to an exemplary embodiment of the invention. The photovoltaic cell 10 is shown to include (among other features), two opposed electrodes 12 and 14, which may be made (for example) of a metal sputtered on the opposite surfaces of an active layer 16, which may be, for example, a semiconductor structure, that has the ability to convert light energy into electric current. The electric current generated by the active layer 16 is conducted by electrodes 12, 14, which are connectible, e.g. via terminals 18, 19, to a receiving device for receiving electric energy (not shown). According to one embodiment, the electrode 14 is provided in the manner of an electrically conductive "net", "web" or "grid" having openings therein. A protective layer (not shown) such as glass or a similar material may be applied to one of the electrodes 14, forming a first side 11 shown as a light receiving side of the photovoltaic cell 10. Cell 10 also includes a second side 13, from which heat may be transferred to a coolant. The photovoltaic cell 10, which is shown in a sectional view in FIG. 1, may be fabricated having any desired shape, such as a square or rectangular plate, and a plurality of such plates may be used to define a system for converting solar energy into electricity. According to another embodiment (not shown), the electrode 14 is provided as a solid transparent electrode that lets sunlight to pass through it to the active layer 16. According to yet another embodiment (not shown), both electrodes can be located at the second side of the photovoltaic cell.

In order to increase the ratio of electric output power to photovoltaic cell surface area, the photovoltaic cells 10 are used with solar concentrators, which are refracting and/or reflecting devices that concentrate and direct solar radiation (i.e. sunlight, etc.) on to the first side 11 (i.e. light receiving side) of cell 10. For example, a system of mirrors may be used for concentrating and/or directing the solar energy to the cell 10, and this system may be movable to follow the daily earth rotation (i.e. "track the sun") so as to enhance solar energy reception throughout the daytime. A system composed of a photovoltaic cell (or a plurality of photovoltaic cells), an evaporation cooling chamber and solar concentrators that are used for focusing solar radiation on the light receiving surfaces of the cells is referred to herein as a photovoltaic solar power unit of the solar power generation system.

Referring to FIGS. 2 and 3, a photovoltaic solar power unit 102 having a plurality of photovoltaic cells 110 is shown according to one exemplary embodiment, where like components that have been previously described are now prefaced with "1" (e.g. 110, 112, 114, etc.). The cells 110, which are shown for example in the form of plates, include a light receiving side 111 oriented toward a solar concentration device shown as a system of one or more reflectors 122 (such as a curved or concave mirror or other reflective surface, or two or more planar mirrors mounted at an angle with respect to each other, etc.). The reflective side of the reflector 122, which is aimed at the sun, faces toward the light receiving side 111 of the photovoltaic cells 110 in such a manner that the solar radiation incident upon the reflector 122 is directed to the light receiving side 111 of the photovoltaic cells 110 to pass through the protective layer (if present) and to penetrate the active layer 116. As a result, electric current will be generated and delivered via electrodes 112, 114 to terminals 118, 119 of the photovoltaic cells. It will be understood that the respective electrodes 112, 114 of the individual photovoltaic cells 110 are interconnected (not shown) to form an integrated electric circuit between the terminals 118, 119.

Figure 8A:
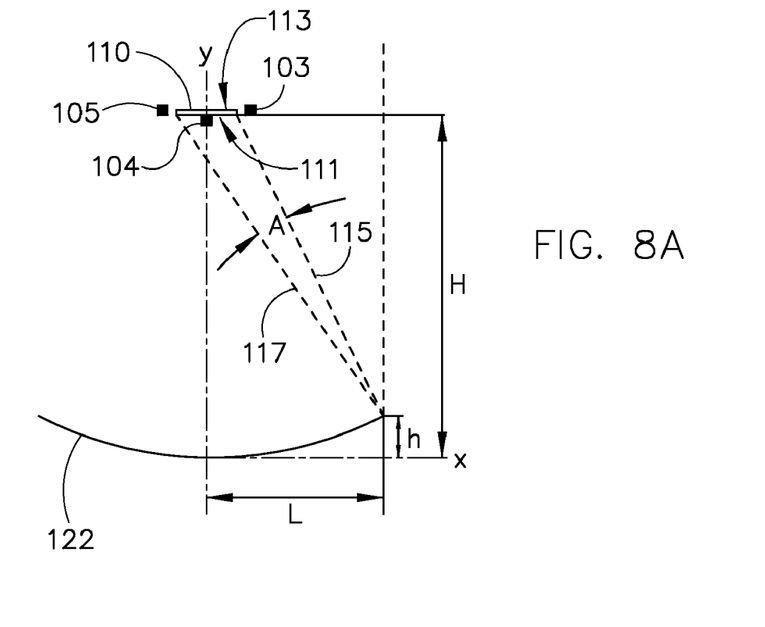
FIG. 8A is a schematic cross sectional image of a portion of a photovoltaic cell and a solar energy concentration device of the solar power generation system, according to an exemplary embodiment.

Referring to FIG. 8A, the solar collector of the embodiment shown in FIG. 3 is shown in further detail, according to an exemplary embodiment, where like components that have been previously described are prefaced with "1" (e.g. 110, etc.). Reflectors 122 are shown as parabolic reflectors and are positioned so that cell 110 is in the focus of the parabolic reflector 122 at a height "H" above the reflector's apex, and centered relative to the reflector 122. The reflector 122 has a dimension "L" from its center to its outside edges, and the outside edges have a height "h" above its apex. According to one preferred embodiment, the ratio between dimensions H and L is within a range of approximately H=1.0 L through H=1.4 L, and more particularly within a range of approximately H=1.1 L through H=1.3 L, and more particularly still, approximately H=1.2 L (alternatively, this relationship may be expressed between dimensions h and L, where the relationship H=1.2 L may be expressed as approximately h=0.21 L). The Applicants believe that use of a parabolic reflector 122 configured in a manner such that H=1.2 L, would maximize an angle "A" between the two dashed lines 115, 117 and enhance the focusing of sunlight from the reflector 122 onto the cell 110.

The photovoltaic solar power unit shown in FIGS. 2-4 is shown by way of example for illustration purposes, and it will be understood that many other devices and arrangements can be used for concentrating solar radiation on the light receiving side of the photovoltaic cell 110. A particular configuration of the unit may be determined for each specific application.

It is generally believed at the present time that solar energy conversion into electric energy is one of the more efficient ways of conversion when it is accomplished directly in a photovoltaic cell. The conversion using solar radiation concentration on the photovoltaic cell is particularly cost effective. One challenge presented by concentration of solar energy upon a photovoltaic cell is a substantial amount of heat that is released at the surface of, and within, the photovoltaic cell as a result of solar energy concentration. In some instances, the heating can be sufficiently high that it can even damage or destroy the photovoltaic cell. Thus, a source of cooling is typically required, especially when large numbers of photovoltaic cells are integrated, and the heat cannot be removed in a conventional manner such as natural convection. It should also be understood that cooling systems would normally require certain energy consumption for their operation (e.g. fans, circulation pumps, compressors, etc.), which adversely affects the overall efficiency of a solar power generation system.

Referring further to FIGS. 2 and 3, the photovoltaic cell 110, and one portion of a sealed evaporative cooling system for cooling the cell 110, for the solar power generation system are shown integrated together to form a unit according to an exemplary embodiment. The sealed evaporative cooling system may be completely sealed, or may be substantially sealed such that the partial air pressure of the air within the evaporative cooling system is less than the partial vapor pressure of the coolant in the system. The unit includes an evaporative cooling chamber 124, which is shown for example as an 'open' or 'bottomless' casing or enclosure having side walls 126, end walls 128, and a top wall 130. The bottom wall of the casing of the evaporative cooling chamber 124 is defined by a second side 113 of the photovoltaic cells 110 (i.e. opposite from the light receiving surface 111 of the first side of the cells 110. The above-described walls of the evaporative cooling chamber 124 and the photovoltaic cells 110 define an interior space 132, which contains a coolant that is used for cooling of the photovoltaic cells 110 by transferring heat from the second side 113 of the cell 110 to the coolant through contact cooling (e.g. direct contact between the coolant and the second side of the cell, or through intervening structures of the chamber disposed between the cell and the coolant, such as described more particularly below). According to alternative embodiments, the evaporative cooling chamber may have any desired shape, and the photovoltaic cell may define any desired wall (or other boundary) of the chamber. As shown in FIG. 2, a plurality of photovoltaic cells 110 define with the evaporative cooling chamber 124 a module, which can be assembled with a plurality of other modules (e.g. of the same shape and size) to build a solar power generation system of a desired scale.

The light receiving surface 111 of the cells 110 may span the entire surface of the bottom wall of the evaporating cooling chamber 124. However, according to other embodiments, the light receiving surface may span only a portion of the bottom wall of the evaporating cooling chamber 124 as may be desirable based on the intensity of the solar radiation received from the solar concentrator. For example, if the amount of energy received from the solar concentrator (shown as reflector 122) is expected to exceed a particular rating (e.g. thermal, electrical, etc.) of the cell 110, the area of the light receiving surface 111 may cover only a portion of the bottom wall of the evaporating cooling chamber 124, shown for example in FIG. 4 as a central portion of the bottom wall of the evaporating cooling chamber 124. According to alternative embodiments the area of the light receiving surface may be configured in a shape or arrangement to suit a desired application.

Referring further to FIGS. 2 and 3, the evaporative cooling chamber 124 is shown according to one embodiment to include a support, which is fixed within the interior space 132. The support is shown for example as a latticed support 136 which includes bars 138 having flanges 139, which are supported by flanges 140 of the walls 126 protruding into the interior space 132 of the evaporative cooling chamber 124. The flanges 140 are shown provided over the entire inside perimeter of the evaporative cooling chamber to provide support for the photovoltaic cells 110 as described further below. The latticed support 136 also includes a support device 142, which can be made as screen or other suitable structure, and may have apertures therein (e.g. perforated, etc.) or may be a solid member. The support device or screen 142 is shown positioned between the flanges 140 and the photovoltaic cells 110. According to the illustrated embodiment, the screen 142 is sized in such a manner as to leave a space between the inner edges of the flanges 140 of the walls 126, 128 and the flanges 139 of bars 138, respectively, and the outer edges of the screen 142. A surface 144 of the screen 142 that is opposite to the photovoltaic cell 110 bears against the flanges 139 of the bars 138 of the latticed support 136 and the flanges 140 of the walls 126, 128 of the evaporative cooling chamber 124. When the unit, which is composed of the evaporative cooling chamber 124 and the photovoltaic cells 110, is assembled (e.g. using an adhesive such as glue 146, or any other appropriate method for attaching the cells to the evaporative cooling chamber), the electrode 112 of each photovoltaic cell 110 will bear against the screen 142, which is supported by the flanges 139 of the bars 138 of the latticed support 136 and the flanges 140 of the walls 126, 128 of the evaporative cooling chamber 124.

It will be understood to those skilled in the art that the latticed support 136 and the screen 142 are intended to illustrate one possible support arrangement within the chamber, and that other supports may be designed differently from what is shown in the above-described embodiment, but one objective in the construction of the unit composed of the evaporative cooling chamber 124 and the photovoltaic cells 110 will be to seal the interior space 132 of the evaporative cooling chamber 124 to the second side 113 of the photovoltaic cell 110 to provide a chamber for a direct contact cooling relationship between the second side 113 of the cell 110 (and/or the various components of the support structure within the chamber) and the coolant, and to provide a reliable support for the photovoltaic cells 110 in order to minimize the potential for mechanical damage. The bars 138 of the latticed support 136 and the screen 142 can be made of any materials suitable for use in the environment within the evaporative cooling chamber 124. According to one embodiment, it is desirable to use metal at least for screen 142 in order to provide for a high electrical conductivity. Use of metal is also intended to advantageously interconnect all of the electrodes 112 of the same polarity without using any other special devices so as to interconnect these electrodes by a simple assembly process. The spacing of the bars 138 is intended to correspond to the size of individual photovoltaic cells 110. For example, according to one embodiment with the photovoltaic cells measuring approximately 150×150 mm, the center distance between the adjacent bars 138 can be, for instance, approximately 150×150 mm (i.e. corresponding generally to the shape and size of the cell), and the bar thickness can be about 10 mm to provide enough support for the photovoltaic cells 110. The evaporative cooling chamber 124 also includes ports 148, 150, and 152 for connecting the evaporative cooling chamber 124 to other components of the cooling system, which will be described further below. The evaporative cooling chamber 124 is partially filled with a liquid coolant to a certain predetermined level, which is intended to be limited by the port 150.

Figure 5:
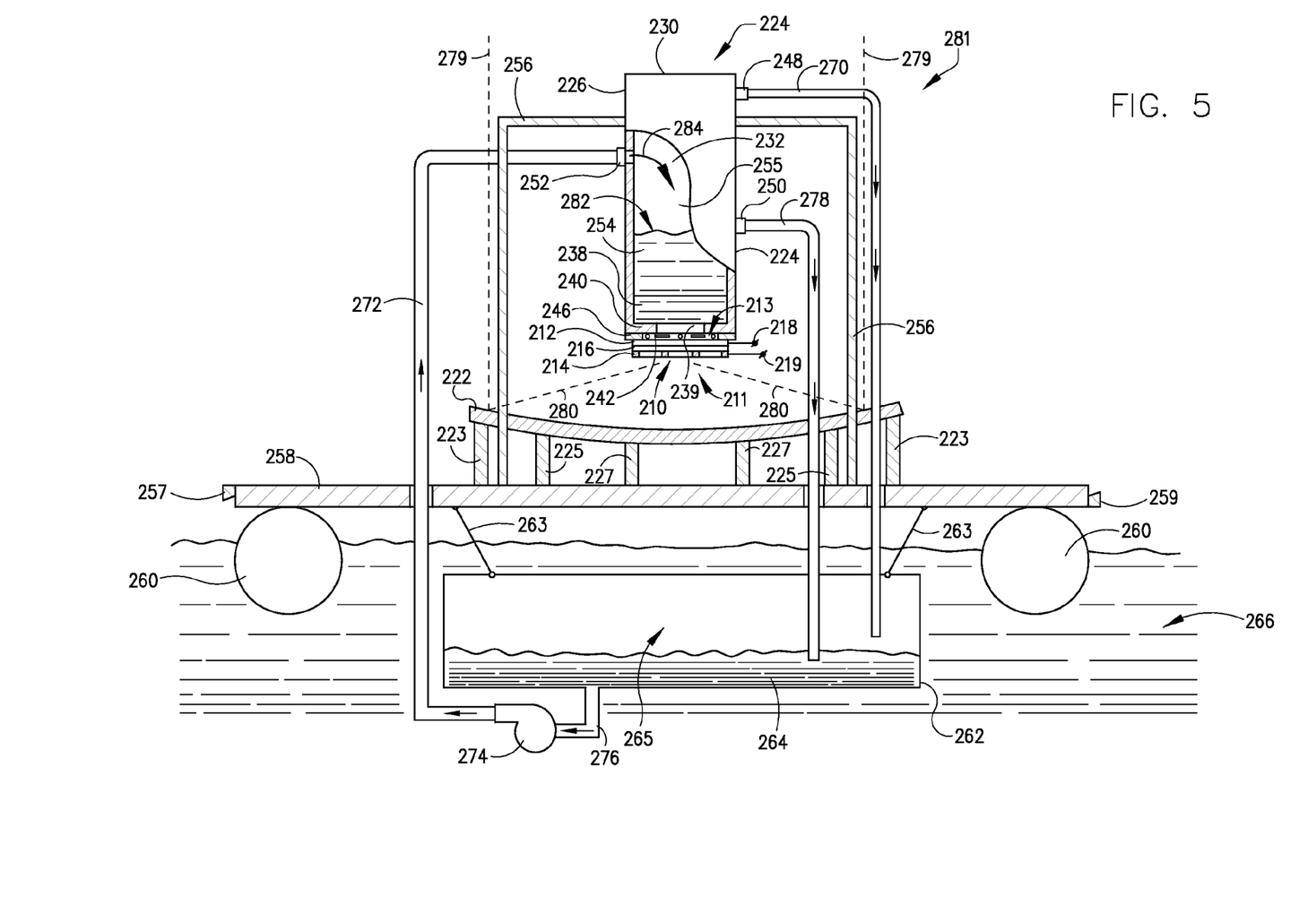
FIG. 5 is a schematic image of a front elevation view of a solar power module according to an exemplary embodiment.

Referring to FIG. 5, a solar power module 281 having a solar concentrator, a photovoltaic cell and a sealed evaporative cooling system, is shown according to an exemplary embodiment, where like components that have been previously described are now prefaced with "2" (e.g. 210, 212, 214, etc.).

As shown in FIG. 5, the evaporative cooling chamber 224 and the photovoltaic cells 210, which is shown in the same view as in FIG. 3, is supported by supports 256 on a floating base 258, having flotation devices such as pontoons 260 attached to the underside of the floating base 258. The coolant circulating through the evaporative cooling system is designated by separate reference numbers corresponding to various locations within the system for clarity. Coolant (in a liquid state) within the condenser is designated by reference numeral 264. Coolant (in a liquid state) within the evaporative cooling chamber is designated by reference numeral 254. Coolant (in a vapor state) within the evaporative cooling chamber is designated by reference numeral 255. Coolant (in a vapor state) within the condenser is designated by reference numeral 265.

Referring further to FIG. 5, the reflector 222 is supported on the floating base 258 by supports 223, 225, 227. According to alternative embodiments, the design and layout of the reflector 222 can be different, and the reflector 222 can be substituted by any other suitable device(s) for concentrating sunlight on the photovoltaic cells, which will be further described herein. A condenser 262 contains a coolant in a liquid state 264 and is attached to the base 258 by supports 263 and is made as a vessel that communicates with the other components of the sealed evaporative cooling system. The condenser 262 transfers heat from the coolant to a heat sink shown as a body of water 266 to condense coolant in a vapor state received from the evaporative cooling chamber. The body of water 266 may be any suitable body of water having sufficient volume to provide a reliable source of cooling at a relatively constant temperature (e.g. a water reservoir such as a pond, a lake or any artificial or man-made reservoir in an excavation or in a large open basin of any kind filled with water, or a stream of flowing water, etc.). The condenser 262 may be supported on the body of water 266 by buoyancy forces (e.g. it's own buoyancy or supplemental buoyancy devices such as pontoons 260, etc.), or the condenser 262 may be supported on a foundation (not shown) and communicate in a cooling relationship with the body of water. According to one embodiment, the condenser 262 is intended to be at least partially submerged in the body of water 266.

The pontoons 260 can be attached to the floating base 258 by use of a pivotal arrangement that allows each pontoon 260 to rotate freely about the vertical axis of the pivotal arrangement (not shown). The pivotal mounting of the pontoons is intended to minimize the hydraulic drag of the pontoons when the platform rotates (i.e. follows the changing position of the sun) because the pontoons will take the most advantageous position (i.e. the position of least resistance as the pontoons move through the body of water). This position of the pontoons 260 will minimize the demand for energy that is used to rotate the platform. In addition, the pontoons, or the condenser, may include damping device such as baffles or the like that are intended to minimize movement (e.g. rocking, etc.) of the platform in the event that the platform is subject to external forces such as wind, waves, etc. The above-described modifications and additions are given as non-limiting examples only, and they also can be modified and/or supplemented.

Figure 11:
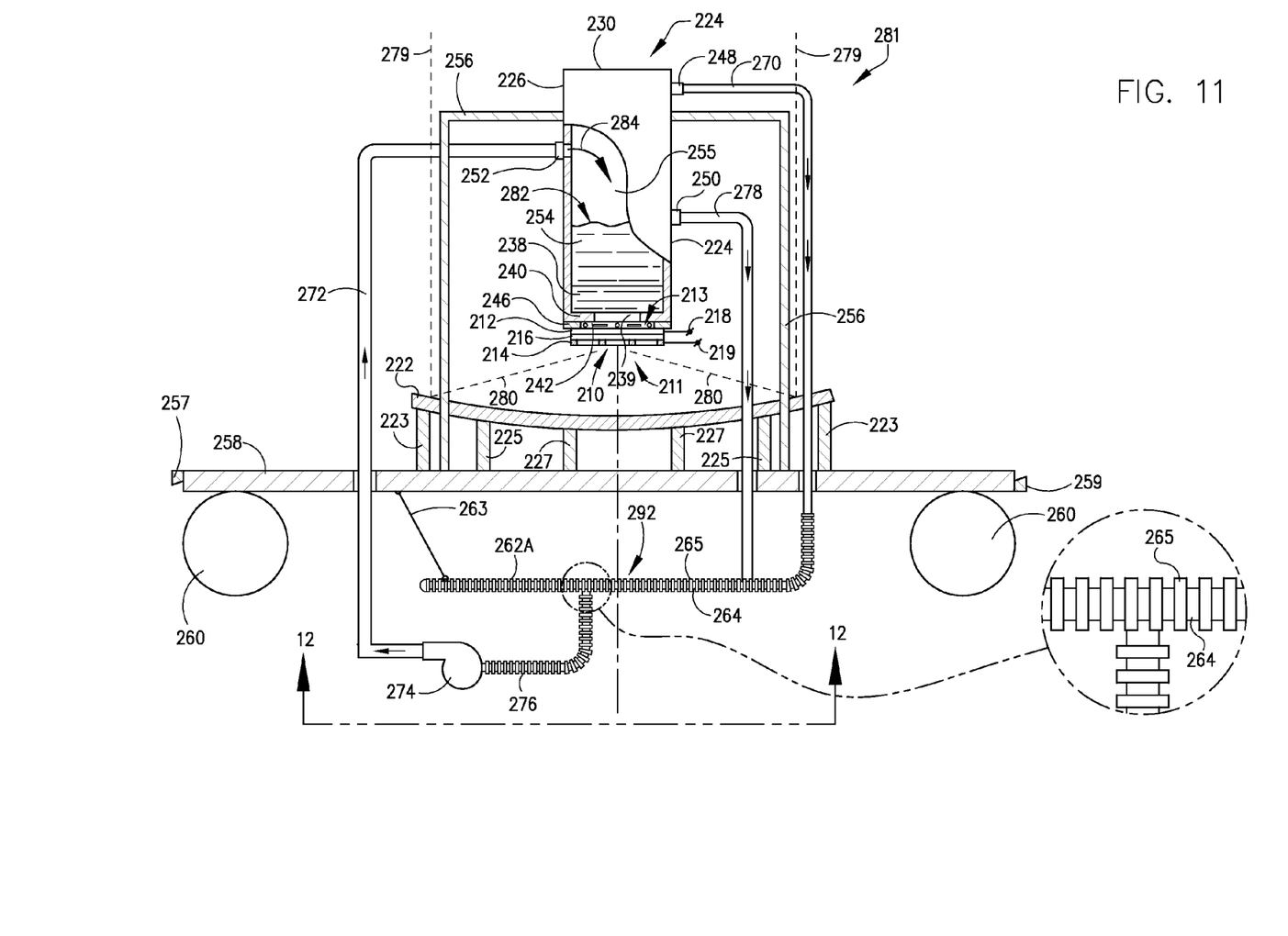
FIG. 11 is a schematic image of a front elevation view of a solar power module with a condenser according to another embodiment.
Figure 12:
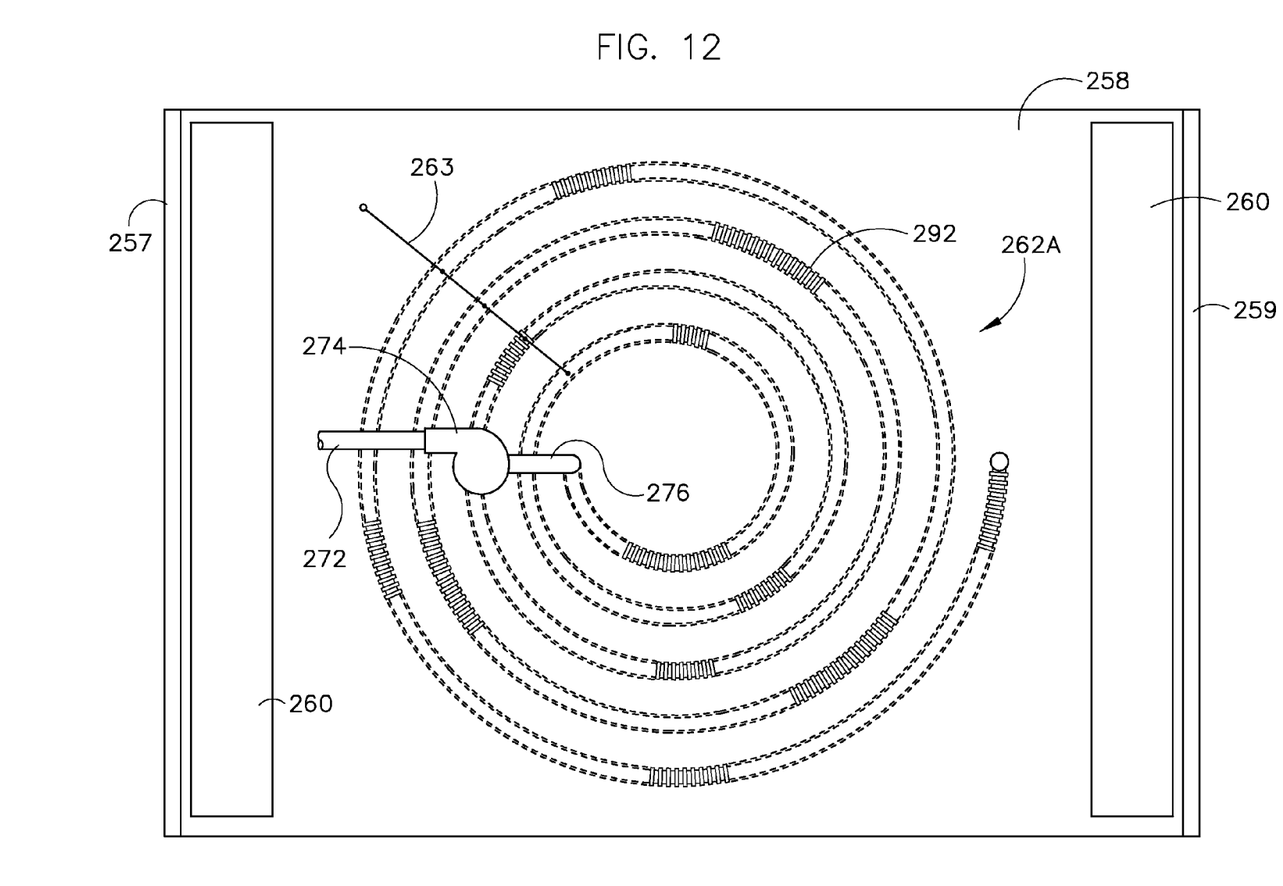
FIG. 12 is a schematic cross sectional image along line 12-12 of FIG. 11.

Referring to FIGS. 11 and 12, another embodiment of a condenser is shown according to an exemplary embodiment. Condenser 262A, is shown by way of example to include a system of interconnected pipes, such as a coil 292 built of a pipe, conduit, or a hose with interior structural members (e.g., a coil spring, etc.). Plain, corrugated (as shown by way of example in FIGS. 11 and 12) or ribbed pipes can be used to build the condenser 262A according to these embodiments and made from a suitable material such as plastic, metal, etc. According to the illustrated embodiment and referring to the same reference numeral sequence established in FIG. 5, where like numerals refer to like components, condenser 262A is formed from a corrugated pipe configured substantially in the shape of a horizontally-oriented coil (or other suitable shape) and at least partially submerged in body of water 266. The condenser 262A receives coolant in a liquid or vapor state from coolant return lines 270 and 278. The coil has sufficient volume to contain a liquid coolant region 264 and a vapor coolant region 265 therein. A liquid coolant suction line 276 extends downwardly from coil 292 to a suction side of coolant conveyance device 274 (shown for example as a pump).

Referring further to FIG. 5, the vapor coolant return line 270 is shown connected to the port 248 of the evaporative cooling chamber 224 in the upper part thereof. The vapor coolant return line 270 is shown by way of example as a pipe that terminates within and opens into the interior space of the condenser 262 above the maximum level of the liquid 264 in the condenser 262. When coolant vapor 255 forms in the interior space 232 of the evaporative cooling chamber 224 as a result of evaporation of the liquid coolant 254 in the interior space 232, it will be removed under its own pressure through the vapor coolant return line 270 into the interior space of the condenser 262. The coolant vapor 255 would not typically return from the chamber 224 to the condenser 262 through the liquid coolant return line 278 because of a slight back-pressure condition that exists with the open end of liquid coolant return line 278 disposed beneath the surface of the liquid coolant 264 in the condenser 262. According to an alternative embodiment, a hydraulic lock may be added at port 230 to suppress water overflow through line 278 in order to minimize or prevent vapor return through line 278.

As a result of evaporation of the liquid coolant 254 in the evaporative cooling chamber 224, the liquid level will drop. To make-up for the loss of liquid coolant 254 by evaporation in the evaporative cooling chamber 224, a liquid coolant supply line 272 is connected between the port 252 of the evaporative cooling chamber 224 and the discharge side of coolant conveyance device (shown as a circulation pump 274) that is shown having its suction side communicating with the bottom part of the condenser 262 by a suction pipe 276. The circulation pump 274 is intended to pump the liquid coolant 264 from the condenser 262 back into the evaporative cooling chamber 224, and, as a result, the evaporative cooling chamber will maintain a sufficient quantity of liquid coolant for cooling the photovoltaic cells 210. A liquid coolant return line 278 (e.g. overflow pipe, etc.) is shown connected to the port 250 of the evaporative cooling chamber 224 to drain any excessive amount of liquid coolant 254 if the liquid coolant level within the evaporative cooling chamber 224 is above the limit defined by the position of the port 250. The liquid coolant return line 278 is shown terminating within and opening into the interior space of the condenser 262. According to an alternative embodiment (not shown), the liquid coolant return line 278 can open into the interior space of the vapor coolant return line 270 at the side opposite to the port 250.

According to alternative embodiments, different methods for returning the liquid coolant into the evaporative cooling chamber 224 can also be used. For example, the liquid coolant can be supplied from the condenser 262 to the evaporative cooling chamber 224 by use of a makeup pipeline filled with a wick material (not shown) operable to provide capillary liquid lift from the condenser 262 to the evaporative cooling chamber 224.

According to the embodiment illustrated in FIG. 5, the condenser 262, together with the evaporative cooling chamber 224, a vapor coolant return line 270, a liquid coolant return line 278, a liquid coolant supply line 272, and a coolant conveyance device (e.g. pump) 274, define a hermetically sealed evaporative cooling system for the photovoltaic cells 210.

It will be understood that the devices depicted in FIGS. 2 through 5 define one embodiment of a solar power module 281, having a hermetically sealed evaporative cooling system designed for cooling the photovoltaic cells 210 through direct contact (or at least partial contact) evaporative cooling between the coolant and the second side 213 of the cell 210, when cells 210 are illuminated by concentrated sunlight which is directed from the reflectors 222 and is incident upon the light-receiving surfaces 211 of the cells 210.

Operation of the evaporative cooling system will now be described with further reference to FIG. 5. When sun light (shown schematically by dotted lines 279) is incident upon the reflector 222 (e.g. during daylight), the reflector 222 concentrates and directs the sunlight to the light-receiving surfaces 211 of the photovoltaic cells 210 as shown by dotted lines 280, and the sunlight will pass through a protective layer (if present) and act upon the active layer 216, which will convert the energy of the sunlight into electric current going through the electrodes 212, 214 to the terminals 218, 219. The sunlight incident upon the photovoltaic cells 210 tends to heat the cells to an extent that removal of at least a portion of the heat is required, or at least desired. The liquid 254 in the interior space 232 of the evaporative cooling chamber 224 is heated by contact with the support device 242 and by the contact with the surface of the electrode 212 (and/or other portions of the second side 211 of the photovoltaic cell 210) and will begin evaporating at a certain point within the interior space 232 of the evaporative cooling chamber 224 moving in upward direction from the liquid 254 into the vapor 255. The liquid coolant and vapor coolant within the chamber are expected to remain in thermal equilibrium at a temperature corresponding to the saturation temperature of the coolant at the pressure within the chamber. The vapor pressure forces the coolant vapor to flow through the port 248 and through vapor coolant return line 270 into the interior space of the condenser 262, which is cooled because it is at least partially submerged in the body of water 266, to condense the coolant from the vapor state to a liquid state.

The temperature of the water in the body of water 266 is expected to remain relatively constant because the amount of heat removed from the condenser 262 is commensurable with the amount of heat that the water in the body of water 266 would have been received through a natural insolation of the water surface if this water surface was exposed to sunlight. The coolant vapor admitted to the condenser 262 will be condensed and returned to the liquid state 264. As mentioned above, evaporation of liquid coolant 254 in the interior space 232 of the evaporative cooling chamber 224 results in the quantity of the liquid coolant 254 in the evaporative cooling chamber 224 being decreased. To make-up for coolant evaporation in the evaporative cooling chamber 224, the coolant conveyance device 274 directs (e.g. pumps, transfers, etc.) the liquid coolant 264 from the condenser 262 through liquid coolant supply line 272 into the interior space 232 of the evaporative cooling chamber 224 through the port 252. As can be seen, the port 252 is located above the maximum expected level 282 of the liquid coolant 254 in the evaporative cooling chamber 224. With this construction, the liquid coolant discharges from the port 252 into the interior space 232 (as shown by arrow 284) is not intended to be in a continuous immediate electric contact with the liquid coolant 254 that is in contact with the electrodes 212 of the photovoltaic cells 210. In addition, a flow breaking device (not shown) can be provided at the port 252 to break down the stream 284 of liquid coolant into a spray of discontinuous "jets" of liquid coolant, to minimize formation of any path of electric losses through the liquid coolant.

According to any exemplary embodiment, the cross-sectional size (i.e. internal area) of the vapor coolant return line 270 is intended to be large enough to maintain a substantially uniform absolute pressure (i.e. corresponding to a vacuum condition) of vapor coolant in both the interior space 232 of the evaporative cooling chamber 224 and in the interior space of the condenser 262. Therefore, the liquid coolant 254 and vapor coolant 255 in the interior space 232 of the evaporative cooling chamber 224 and the liquid coolant 264 and vapor coolant 265 in the interior space of the condenser 264, respectively, are substantially in a thermal equilibrium, which is based on a thermodynamic balance between the amount of heat removed from the photovoltaic cells 210 and transferred to the liquid coolant 254 in the evaporative cooling chamber 224, on the one hand, and the amount of heat removed from the vapor coolant 265 in the condenser 262 and transferred to the body of water 266 interfacing with the condenser 262, on the other hand. An equilibrium temperature should be established in the cooling system, and the closed system design should ensure that the equilibrium temperature is low enough to provide for efficient functioning of the photovoltaic cells 210. For example, if the heat transfer surface between the coolant 264 in the condenser 262 and the body of water 266 is equal to approximately 80% of the solar concentrator surface receiving sun light directly from the sun, the heat transfer coefficient from the coolant 264 in the condenser 262 to the body of water 266 is approximately 200 W/(K m$^2$), the sunlight radiation flux converted to heat is approximately 800 W/m$^2$ (assuming that the insolation level of the solar concentrator is 1 kW/m$^2$, and 20% of this radiation is converted to electricity by the cell), and the water temperature in the body of water 266 is 20° C., then the equilibrium temperature of the coolant in the system is approximately 24° C., and the temperature of the second side 113 of the cell is approximately 25° C. Further decrease of this temperature can be achieved by additional development of the heat transfer surface between the coolant 264 in the condenser 262 and the body of water 266 (not shown).

According to one embodiment, a diameter of the vapor coolant return line is configured to ensure substantially the same pressure of the vapor coolant 265 in the condenser 262 and of the vapor coolant 255 in the evaporative cooling chamber 224. The Applicants believe this can be achieved if the following non-equality relationship is maintained:

$$A/S > 3E/(\rho rc)$$

Where:
A=the aperture area of the vapor coolant return line, m$^2$
S=the total area of a primary sunlight receiving device such as the reflector 122 of the Fresnal lens 119 in FIG. 8B served by this line, m$^2$
E=1000 W/m$^2$, a typical level of insolation under clear sky
ρ=the vapor density at the operation temperature, kg/m$^3$
r=the specific heat of evaporation of coolant, J/kg, and
c=the speed of sound in the coolant vapor at operating temperature, m/s If this non-equality relationship is not maintained, the Applicants believe that system efficiency would be expected to decrease as the temperature of coolant in the evaporative cooling chamber 224 is substantially higher than the temperature of coolant in the condenser 262.

The Applicants believe that a similar non-equality relationship exists limiting the surface area of the liquid coolant 254 in the evaporative cooling chamber 224 to maintain emission of coolant from port 248 in a vapor state:

$$F/S > E/(\rho rv)$$

Where,
F=the area of the liquid surface in the evaporative cooling chamber 224, m$^2$, and
v=0.3 m/s is the maximum allowable vertical effective speed of vapor (calculated as the ratio to the volumetric flow rate of vapor in evaporative cooling chamber 224 to area F).

If this non-equality relationship is not maintained, the Applicants believe that the actual vertical effective speed of vapor increases above the threshold of 0.3 m/s, and the evaporative cooling chamber 224 would at least partially emit liquid coolant from port 248 rather than complete vapor coolant.

For embodiments where the cell 210 covers the entire bottom surface of the evaporative cooling chamber 224, then the Applicants believe that F/S=1/X, where X is the level of sunlight concentration. Then, this inequality can be re-written as follows:

$$X < \rho rv/E$$

In this form, the inequality limits a level of sunlight concentration that can be achieved by a system where the cell 210 covers the entire bottom surface of the evaporative cooling chamber 224. In the event that a higher level of concentration is desired than prescribed by this inequality, an evaporative cooling chamber 224 having a width that is greater (i.e. wider) than the cell may be provided (e.g. such where the light receiving surface 111 of the cell 110 only partially covers the bottom surface of the evaporative cooling chamber, such as shown by way of example in FIG. 4).

The photovoltaic cells 210 are generally understood to have increasing efficiency as their operating temperature decreases. More specifically, the Applicants believe that the electric power output of the photovoltaic cells could be increased substantially if the photovoltaic cell worked at a lower temperature, and if all air (or other gas) is removed from the cooling system. The Applicants believe that the presence of air in the system reduces the heat transfer efficiency of the system. Upon removal of the air from the system, heat transfer from the coolant 264 in the condenser 262 to the body of water 266 can be enhanced, and the equilibrium temperature of the coolant determined by the balance of heat received by the coolant from the second side of the cell 212 and the heat removed from the coolant to the body of water 266 can be achieved as previously described. Various methods and/or devices can be used to create a reduced pressure in the system. For example, the cooling system can be put under a reduced pressure initially (i.e. before starting operation) by filling the cooling system with liquid coolant and evacuating the liquid coolant by use of a liquid suction pump or the like. The cooling system may include a 'capped' outlet at the highest point (e.g. in the wall 230 shown in FIG. 5) or either in the liquid coolant supply line 272 or in the vapor coolant return line 270) and another outlet at the lowest point of the system, having a shutoff valve (e.g. at the bottom of the suction line 276, or at the lowest point of the condenser 262, etc.). The cooling system may be filled initially with liquid coolant through the outlet provided at the highest point of the system with the shutoff valve at the lowest point outlet in a closed position. When the cooling system is filled up with liquid coolant, the highest point outlet is capped (or otherwise sealed), and the liquid suction pump (or the like) is operably coupled to a suction port at the lowest point outlet (e.g. the port can be combined with the shutoff valve), and the liquid coolant is evacuated from the cooling system. When the liquid coolant is partially pumped out to create space within the cooling system to be filled with coolant vapor and air or another gas present in the cooling system, the suction port is closed (or otherwise sealed), and the liquid suction pump may be disconnected from the cooling system and removed.

The equilibrium pressure within the constant-volume system is then a function of the equilibrium temperature and the exact correlation between the pressure and the temperature in the system depends on the choice of coolant. The pressure in the evaporative cooling chamber 224 can be made higher by using a coolant having a low boiling temperature, for example, by using a refrigerant as the coolant. By using water as the liquid coolant 254 (264), the sealed evaporative cooling system can be operated at a reduced pressure (e.g. at an absolute pressure that is less than, or below, atmospheric pressure) after filling the cooling system with the liquid coolant and pumping out the liquid coolant from the system using the liquid suction pump (or the like) (not shown) before the initial startup, because the equilibrium pressure corresponding to the boiling temperature of water as described above (see 0042) is sufficiently low. According to one embodiment, the liquid coolant may be untreated water due to its sufficiently low electrical conductivity, although demineralized or distilled water may also be used.

An additional advantage of a reduced operating pressure for the sealed evaporative cooling system is that the second side 213 of the photovoltaic cells 210 will be 'pressed' or drawn more tightly against the flanges 239 of the bars 238 of the latticed support 236 and the flanges 240 of the walls 226, 228 (see FIG. 2) by the surrounding atmospheric pressure thereby enhancing the sealing of the evaporative cooling system.

The amount of liquid coolant in the cooling system is intended to be chosen in such a manner as to avoid complete evaporation of the liquid coolant 254 in the interior space 232 of the evaporative cooling chamber 224, and the interior space 232 is intended to be maintained partly filled with liquid coolant 254 and partly with vapor coolant 255 during daytime operation. On the other hand, if the level of the liquid coolant 254 becomes higher than the port 250, the liquid coolant excess will be drained through the liquid coolant return line 278 to the condenser 262. With a careful analysis of the thermodynamic balance and the amount of the liquid coolant 254 (264) contained in the evaporative cooling system, the excess liquid coolant will escape from the evaporative cooling chamber through the liquid coolant return line 278 in a discontinuous flow formation (e.g. 'splashes' etc.) without forming a continuous electric conduction path. If untreated or demineralized water is used as the liquid coolant 254 (264), a certain electric loss is hypothetically possible through a current path from the electrodes of the photovoltaic cells 210 through the support device 242 and the liquid that flows through the liquid coolant return line 278, leading to the condenser 262, which is grounded through the body of water 266. Such loss can be avoided by breaking down the flow through the liquid coolant return line 278 either by providing a jet breaker (not shown) within the port 250 or by breaking the flow within the liquid coolant return line 278, e.g., by incorporating or attaching a device for ensuring discontinuity of the stream or flow of liquid in the pipe. It will be understood that if a refrigerant is used as the liquid coolant 254 (264), no electric conductivity would be expected through the flows of liquid coolant in the cooling system. It will be apparent that the pipes and/or their fittings and connections can be made completely or at least partially of an electrically insulating material (e.g. plastic, etc.) to provide a more complete electric insulation of the solar power module.

Figure 9:
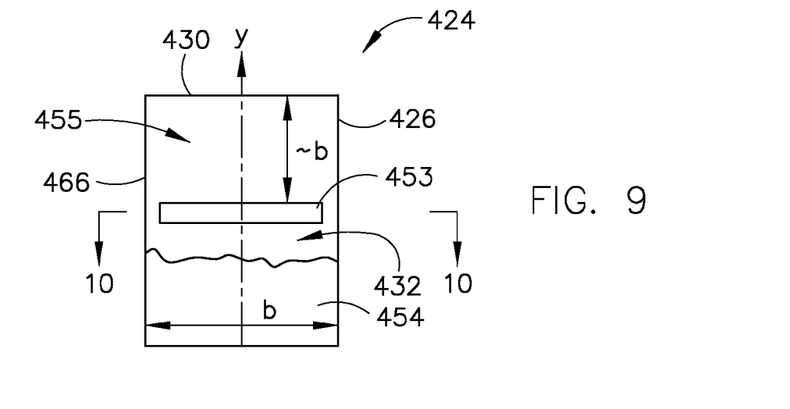
FIG. 9 is a schematic cross sectional image of a evaporative cooling chamber of the solar power generation system, according to an exemplary embodiment.
Figure 10:
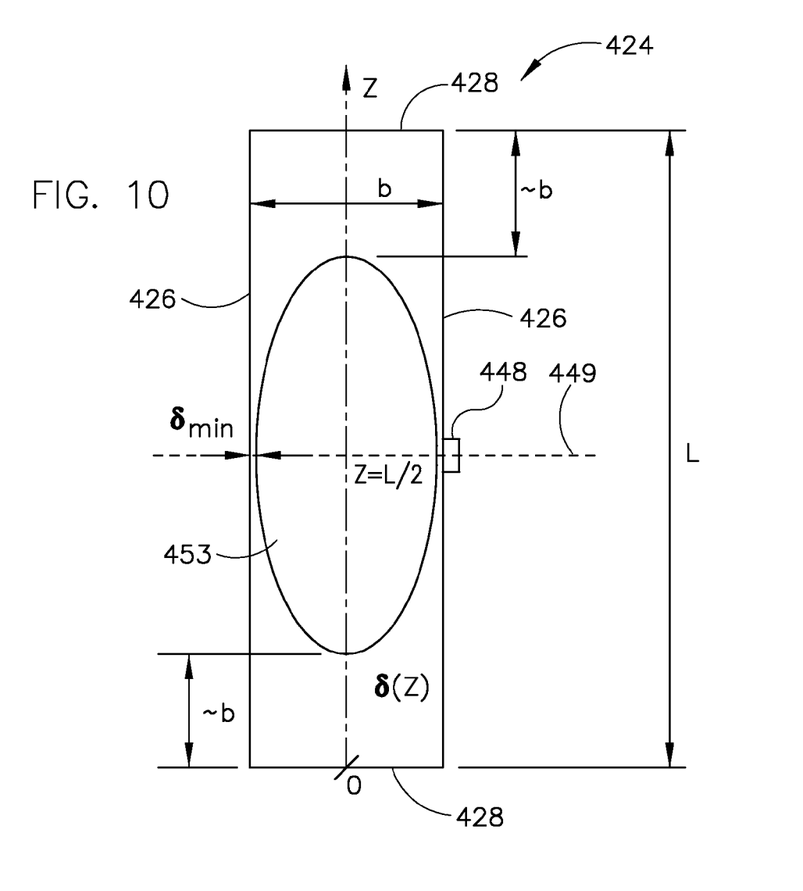
FIG. 10 is a schematic cross sectional image along line 10-10 of FIG. 9.

Referring to FIGS. 9 and 10, another embodiment of the evaporative cooling chamber is provided according to an exemplary embodiment, where like components that have been previously described are now prefaced with "4" (e.g. 424, 428, etc.). The illustrated embodiment is intended to further minimize the potential for emission of liquid coolant from the evaporative cooling chamber. The Applicants believe that it is desirable to avoid a condition where a high horizontal velocity of vapor coolant 455 is directed from one end wall 428 to another end wall, because if the velocity is too high, the pressure drop in this direction is also high (according to Bernoulli law), which may result in foam formation on the surface of liquid coolant 454. Foam formation may tend to increase the amount of liquid coolant 454 emitted from the evaporative cooling chamber 424 via port 448, which would tend to increase the amount of liquid coolant make-up flow required, and decrease the overall efficiency of the system. Accordingly, the evaporative cooling chamber 424 is provided with port 448 positioned at approximately the middle of the side wall as shown in FIG. 10). In this arrangement, coolant vapor 455 approaches port 448 from both sides 428, and the flow rate coming from each side to the interface 448 in direction Z would be approximately half of the total flow rate of coolant vapor 455. In addition, a shaped horizontal plate 453 is disposed at a distance of approximately "b" below the top wall 430, where dimension "b" is substantially equal to the width "b" of the evaporative cooling chamber 424.

According to the illustrated embodiment, plate 453 is substantially symmetrical relative to the dashed (horizontal) line 449, and the end edges of plate 453 are shown located at a distance substantially equal to "b" (i.e. similar to the width of the evaporative cooling chamber 424). Also, the gap between the side edges of plate 453 and the side walls 426 of the evaporative cooling chamber (shown as "δ" which varies between a minimum at the center of plate 453 and a maximum at each end of plate 453) is intended to vary as a function of Z in substantially the following manner: $\delta(Z)=0.5\ b^2/Z$ (this equation is valid for $0<z<L/2$). Accordingly, the minimum gap δ across the interface between the side walls 426 and the edges of plate 453 is $\delta(L/2)=b^2/L$. Referring further to FIG. 9, plate 453 would divide the inner space 432 of the evaporative cooling chamber 424 into two regions: a top region where the speed of coolant vapor is directed horizontally along axis Z toward the port 448 and a bottom region where the speed of coolant vapor is directed upward, and is intended to protect the surface of the liquid coolant 454 from an area of low pressure formed in the top region created by the velocity of coolant vapor 455 in the direction of axis Z by the plate 453, thus minimizing foam formation on the surface of the liquid coolant 454. According to an alternative embodiment, the plate 453 is asymmetrically positioned relative to Z centerline in the evaporative cooling chamber 224 (not shown).

It will be understood from the above description that the provision of the hermetically sealed evaporative cooling system for the photovoltaic cells, which incorporates a condenser at least partially submerged in a water-filled reservoir or other body of water, solves at least two problems. First, the evaporative cooling itself can be accomplished without provision of special measures for insulation of the photovoltaic cell electrodes since the coolant vapor within the interior space of the evaporative cooling chamber is a generally poor electrical conductor, and by avoiding a continuous flow loop of liquid coolant in direct contact (or at least partial contact) with the photovoltaic cells that might require electrical insulation. Second, the evaporative cooling process as disclosed herein according to the exemplary embodiments significantly minimizes any auxiliary power consumption for sustaining its operation (for example, in the embodiment where the coolant conveyance device is a pump, only a fractional horsepower motor/pump unit would be expected for liquid coolant recirculation in the evaporative cooling system), and the efficiency of the solar energy conversion is improved because of the inherently higher cooling efficiency of the evaporative cooling process.

A further advantage of the use of the above-described evaporative cooling system is that the solar power module 281 of the system can be made more compact and can be integrated into a larger solar power generation system with minimal thermal impact on each other or on the environment.

Figure 6:
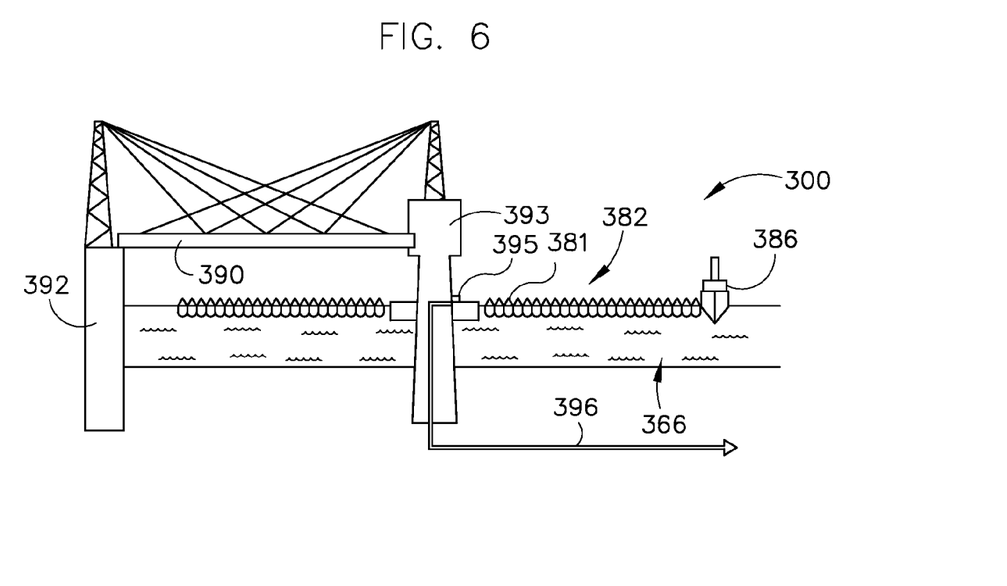
FIG. 6 is a schematic cross sectional image of a solar power generation system having a plurality of the modules of FIG. 5, according to an exemplary embodiment.
Figure 7:
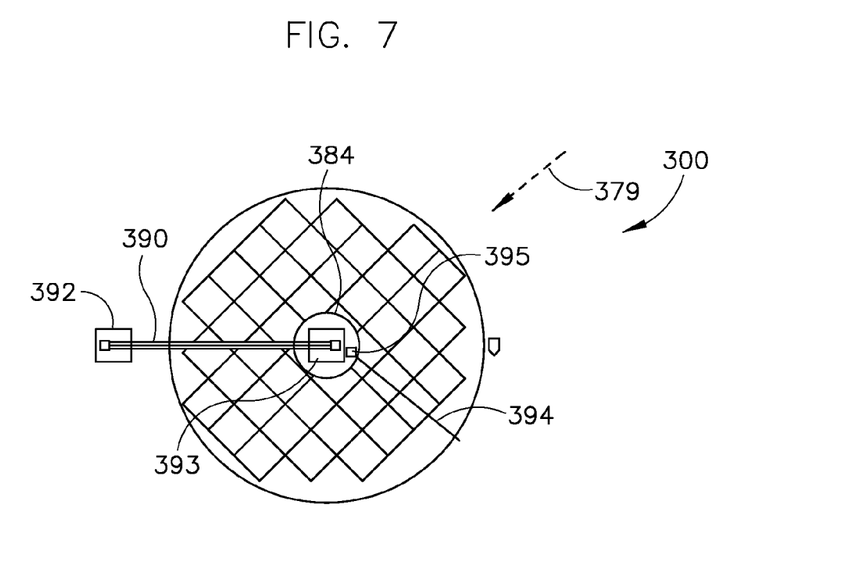
FIG. 7 is a schematic image of a top view of a solar power generation system having a plurality of the modules of FIG. 5, according to an exemplary embodiment.

Referring to FIGS. 6 and 7, a large-scale solar power generation system 300 is shown according to an exemplary embodiment, where like components that have been previously described are now prefaced with "3" (e.g. 366, 381, etc.). Solar power generation system 300 is shown to include a movable platform 382, which may be built up by assembling modules 281 described with reference to FIG. 5, (see 381 in FIG. 6). The modules 381 may be of any length, and are assembled to form an integral body defining the platform 382, which may be circular as shown according to the illustrated embodiment, although other shapes are intended to be within the scope of this disclosure. The platform 382, made up of modules 381, is mounted for rotation about an axle 384 (through use of a hub, bearings, or other suitable devices), and a drive device (shown as a first drive device 386) for rotating the platform to track movement of the sun. According to an alternative embodiment, the platform may rotate about the geometric axis in a non-contact relationship (i.e. driven by a precise control system, positioned by a magnetic filed, etc.) to provide a low friction arrangement. The rotational mounting arrangement for the platform (e.g. through use of an axle, hub, etc.) is also arranged to permit vertical translation of the platform to accommodate fluctuations in water level that may be experienced by the body of water. According to an alternative embodiment, the axle may also comprise a tower for a wind turbine (not shown) configured to generate electricity, and the power output from the wind turbine may be advantageously combined with the power output from each of the modules of the platform to provide a combined wind and solar power generation system.

According to one embodiment shown in FIGS. 6 and 7, the first drive device may be a propulsion device that engages the body of water, such as a tugboat, or a propulsion device (e.g. impeller, propeller, water-jet, etc., which may be operated intermittently, or on a variable speed basis) mounted to the platform and powered by any suitable source (e.g. the electrical output from the cells or other source, a motor or engine running on a hydrocarbon fuel, etc.), or any other suitable device attached to, or integrated with the platform 381 that can be used to bring it in motion. According to an alternative embodiment, the first drive device may comprise 'passive' devices such as wind capture structures (e.g. sails, etc.) intended to capture wind energy to provide a motive force for rotating the platform. Platform rotation is intended to be performed in such a manner as to ensure maximum illumination of the reflectors 222 (see FIG. 5) of the modules 381 by positioning modules 381 substantially along a direction of incident sunlight (shown schematically by a dotted line 379). According to other alternative embodiments, the platform may be guided in rotation by means of rollers coupled thereto and supported by a circular track suitably supported relative to the body of water (e.g. on the bottom of a water reservoir, etc.—not shown). According to another alternative embodiment, the platform may be driven by a suitable gear drive system, such as a ring gear operably coupled to the platform and operably engaged with a motor-driven pinion or the like (not shown).

Referring further to FIG. 8A, a tracking control scheme for controlling the first drive device 386 and positioning the platform 382 to track movement of the sun throughout the day is shown according to an exemplary embodiment. The control scheme is shown to include photo sensors 103, 104, 105 (shown for example as three (3) photo sensors). One photo sensor 103 is shown positioned closely adjacent to the right of the cell 110 (further referred to as the "front sensor" presuming that the direction of platform rotation is selected so that it moves from left to right in FIG. 8A). The second sensor 105 is shown positioned closely adjacent to the left of the cell 110 (further referred to as the "back sensor") and the third sensor 104 is positioned substantially at the center of the light receiving surface 111 of the cell 110 (further referred to as the "central sensor"). The tracking control scheme monitors the difference between the levels of solar irradiation of the central sensor and the front/back sensors as an input variable for tracking. For example, as the level of solar irradiation intensity decreases on the central sensor and increases on either of the front or back sensors, a tracking control signal is provided to the first drive device 386 to change the rate of rotation of the platform 382 to maximize the solar intensity on the central sensor and minimize the solar irradiation intensity on the front sensor and or the back sensor.

According to a preferred embodiment, the central sensor would receive substantially maximum solar irradiation, and the front and back sensors would receive no (or minimal) solar irradiation as the entire flux of sunlight would be directed to the cell 110. In this case, the difference between irradiation of the central sensor and the front and back sensors would reach a maximum level. Any decrease in this signal would indicate that the rotation speed of the platform 382 should be either initiated or increased (if the back sensor is irradiated) or terminated or decreased (if the front sensor is irradiated). According to a further embodiment, each platform 382 includes a plurality of sensor groups (i.e. multiple groups of front, center and back sensors) in order to increase reliability of the tracking control scheme) and a certain computer-based algorithm for processing the output signals of the sensor groups into a single command for activating and/or controlling the first drive device 386 to position the platform 382 for optimum tracking of the sun.

According to an alternative embodiment, the tracking control scheme may omit the central sensor and use the front and back sensors to provide a tracking control signal to the first drive device to move the platform to maintain a solar irradiation intensity on the front and back sensors within a certain predetermined range (i.e. "band", etc.). As the difference in solar intensity detected between the front and back sensors exceeds the predetermined range, the control signal directs the first drive device to rotate the platform as necessary to restore the 'balance' of solar irradiation on the front and back sensors.

Referring further to FIGS. 6 and 7, a service bridge 390 for access to the modules 381 is shown according to an exemplary embodiment. The service bridge 390 is suitably supported relative to the platform and body of water 366, such as by fixed supports 392, 393. An electric cable assembly 394 provides electrical connections between the modules 381 of the platform and a fixed switchgear by means of a current collector device 395 and receiving line 396 installed between the switchgear and the cable assembly. According to one embodiment, receiving line 396 is provided as a flexible receiving line (e.g. cable on a take-up reel, etc.) to accommodate vertical translation of the platform 382 in the event that water level fluctuations are experienced by the body of water 366. According to another alternative embodiment (not shown), support 392 is a floating support. According to yet another alternative embodiment (not shown), support 393 is a floating support. According to yet another alternative embodiment (not shown), both supports 392 and 393 are floating supports.

According to one embodiment, the modules 381 can be integrated to build the platform 382 by using structural members 257, 259 and the end faces of the base 258 of the each module 281 (see FIG. 5) with special hardware (not shown) or any other method, or they can be installed on a preassembled platform. The controls that may be used to ensure rotation of the platform synchronously with the sun position are described herein, but may also be any suitable solar tracking control system such as those that are known to those skilled in the art. According to the illustrated embodiment, each of the modules that make up the platform have a separate condenser (e.g. as shown for example in FIG. 5), which the Applicants believe increases the reliability of the solar power generation system by minimizing the potential that a failure of one condenser (e.g. loss of vacuum, seal, etc.) could adversely effect any of the other modules. However, according to alternative embodiments, a common condenser may be used for multiple, or all, of the modules of the platform.

Figure 8B:
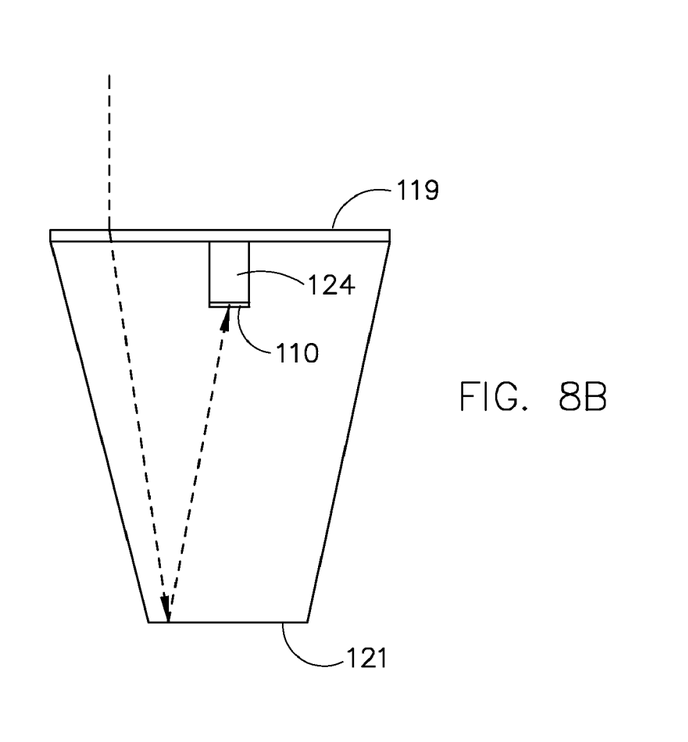
FIG. 8B is a schematic cross sectional image of a portion of a photovoltaic cell and a solar energy concentration device of the solar power generation system, according to another exemplary embodiment.

Referring to FIG. 8B, a solar concentrator is shown according to another exemplary embodiment. In this embodiment, the solar concentrator includes a Fresnel lens 119 positioned directly above the evaporative cooling chamber 124 in order to minimize shadowing of incoming sunlight at a planar mirror 121. The rays of sunlight are reflected on planar mirror 121 and directed to the light receiving side 111 of the cell 110. The mirror 121 may be a fixed flat mirror, or may be configured as a folding mirror. According to an alternative embodiment, the solar concentrator may be at least partially submerged.

According to any exemplary embodiment of the solar power generation system, a monitoring system is provided to monitor proper operation of the system and the condition of each of the individual modules on the platform. The monitoring system includes a temperature monitoring system and a power output monitoring system. The temperature monitoring system utilizes remote monitoring of the temperature of the top surface of some or all of the evaporative cooling chambers. Such temperature monitoring may be accomplished by suitable pyrometric systems or the like that include an emitter and a receiver. The emitter and receiver may be installed on the bottom surface of the service bridge (or other suitable structure). The ray emitted from the emitter will be directed to the top of each evaporative cooling chamber when it travels beneath the bridge as the platform rotates to track the position of the sun. For example, a number of pyrometers may be provided so that the evaporative cooling chamber of each module passing beneath the bridge would be "scanned" by a corresponding pyrometer and a signal representative of the temperature of the chamber would be reflected to the receiver. The signal is then entered into a computer-based system that would determine which of evaporative cooling chambers produced each specific signal. When the temperature of the top surface of an evaporative cooling chamber rises above a certain predetermined threshold or setpoint, the condition may be interpreted as an unacceptable condition or failure of the module associated with the particular evaporative cooling chamber and an appropriate signal (e.g. alarm, annunciator, etc.) is initiated for repairing/replacing the module. For solar concentrator embodiments that include a Fresnel lens (see FIG. 8B) an opening may be provided in the lens for monitoring the temperature of the top surface of the evaporative cooling chamber. The monitoring system is also intended to include a power monitoring system operable to monitor the power output of cells from each of the modules. The power monitoring system may include suitable sensors (e.g. current, voltage, etc.) associated with individual modules (or groups of modules) and may be configured to monitor power output on terminal 18 and 19.

According to any exemplary embodiment, a solar power generation system is provided that includes a module formed from a photovoltaic cell, a solar concentrator, a sealed evaporative cooling system and a heat sink. The solar concentrator focuses sunlight onto a front side (light receiving side) of the photovoltaic cell to generate electricity. The sealed evaporative cooling system circulates a coolant in a liquid state to an evaporative cooling chamber having a wall or other portion defined by a back side of the photovoltaic cell to remove heat from the cell by direct contact between the coolant and the cell, and emits coolant in a vapor state to a condenser where the vapor coolant is condensed to a liquid state. The heat sink may be any suitable body of water with the condenser at least partially submerged in the body of water. Multiple modules may be combined (in a number dictated by the desired capacity of the solar power generation system) to form a platform that is rotated on the body of water by a drive device to provide tracking of the modules relative to movement of the sun.

According to an alternative embodiment, the solar power system may include an evaporative cooling system with a single chamber that is at least partially submerged in the body of water and includes a coolant that removes heat from the second side of the cell. As the coolant is vaporized (e.g. by heat removed from the second side of the cell) the coolant in vapor form is condensed through heat transfer between the walls (or other suitable structure) of the chamber, which are at least partially in contact with the surrounding body of water, to provide coolant in a liquid state which is then available for cooling of the cell.

It is also important to note that the construction and arrangement of the elements of the solar power generation system as shown schematically in the embodiments is illustrative only. Although only a few embodiments have been described in detail in this disclosure, those skilled in the art who review this disclosure will readily appreciate that many modifications are possible without materially departing from the novel teachings and advantages of the subject matter recited.

Accordingly, all such modifications are intended to be included within the scope of the present invention. Other substitutions, modifications, changes and omissions may be made in the design, operating conditions and arrangement of the preferred and other exemplary embodiments without departing from the spirit of the present invention. For example, the position and characteristics of the various structure and components of the evaporative cooling chambers may be varied as necessary to accommodate changes in the dimensions, shape and geometry of the other components of the module. Also, the orientation, shape and arrangement of the reflectors, lenses, and other components of the solar concentrator may be varied as necessary to provide a desired concentration of sunlight on the light receiving surface of the cell.

The order or sequence of any process or method steps may be varied or re-sequenced according to alternative embodiments. In the claims, any means-plus-function clause is intended to cover the structures described herein as performing the recited function and not only structural equivalents but also equivalent structures. Each of the features disclosed herein may be combined with any combination of the other features disclosed herein. Other substitutions, modifications, changes and omissions may be made in the design, operating configuration and arrangement of the preferred and other exemplary embodiments without departing from the spirit of the present invention as expressed in the appended claims.

What is claimed is:

1. A solar power generation system, comprising:
   at least one photovoltaic cell having a first side and a second side;
   a solar concentrator configured to focus solar radiation on the first side of the photovoltaic cell;
   a sealed evaporative cooling system, comprising an evaporative cooling chamber being at least partially configured to remove heat from the second side of the photovoltaic cell, the cooling chamber containing a coolant, and
   a condenser operable to receive the coolant in a vapor state and condense the coolant to a liquid state, and at least one coolant supply line configured to direct the coolant in the liquid state from the condenser to the evaporative cooling chamber, and at least one coolant return line configured to direct the coolant from the evaporative cooling chamber to the condenser wherein the condenser, the coolant supply line, the evaporative cooling chamber, and the coolant return line form a closed circulation system.

2. The system of claim 1, wherein the evaporative cooling system is sealed from atmospheric air.

3. The system of claim 1, wherein the condenser is configured to be at least partially submerged in the body of water.

4. The system of claim 3 wherein the chamber is defined at least partially by the second side of the photovoltaic cell.

5. The system of claim 3 further comprising a coolant conveyance device configured to convey the coolant in a liquid state from the condenser to the evaporative cooling chamber, and wherein the coolant conveyance device comprises a makeup fluid conveyance device.

6. The system of claim 3 wherein the at least one coolant return line comprises an overflow coolant return line and a vapor coolant return line; the overflow coolant return line communicating with the evaporative cooling chamber at a first elevation to define a maximum liquid coolant level within the evaporative cooling chamber, and the vapor coolant return line communicating with the evaporative cooling chamber at a second elevation that is higher than the first elevation.

7. The system of claim 3 wherein the condenser comprises a plastic conduit that is configured to transfer heat from the coolant to a body of water, the conduit having a corrugated wall.

8. The system of claim 3 wherein a partial pressure of air within the evaporative cooling system is less than a partial pressure of the coolant vapor.

9. The system of claim 3 wherein the photovoltaic cell comprises at least one electrode, the electrode exposed to the coolant in the liquid state in an interior space of the evaporative cooling chamber.

10. The system of claim 3, wherein the photovoltaic cell and the solar concentrator are operably coupled to a platform, the solar concentrator and the photovoltaic cell and the sealed evaporative cooling system are included in a module, and further comprising a plurality of modules disposed on the platform, a drive device configured to rotate the platform, and a floatation device configured to float the platform on a body of water.

11. The system of claim 10, further comprising a tracking system configured to rotate the platform, the tracking system comprising a first sensor disposed closely adjacent to a first edge of the photovoltaic cell and a second sensor disposed closely adjacent to a second edge of the photovoltaic cell and a third sensor disposed intermediate the first and second edges of the photovoltaic cell, and configured to provide a signal to the drive device to control rotation of the platform based upon a difference between the levels of solar irradiation on the sensors.

12. The system of claim 3, wherein the solar concentrator comprises a parabolic reflector having an apex and opposite edges, where each edge is spaced from the apex by a first distance L, and the photovoltaic cell is disposed above the apex of the parabolic reflector by a second distance H, so that H is substantially within the range of 1.0 L-1.4 L.

13. The system of claim 3, wherein the solar concentrator comprises one or more reflectors, and further including a service structure extending across a least a portion of a platform and providing access to the platform, where the service structure is immobile.

14. The system of claim 3, wherein the solar concentrator comprises a Fresnel lens and a reflector, the reflector having a width that is greater than the width of the photovoltaic cell and smaller than the width of the Fresnel lens.

15. The system of claim 3 wherein the pressure within the sealed evaporative cooling assembly is lower than atmospheric pressure.

16. A solar power generation system, comprising:
   a condenser operable to receive a coolant in a vapor phase and condense the coolant to a liquid phase; and
   a plurality of modules, comprising:
      at least one photovoltaic cell having a first side and a second side;
      a solar concentrator configured to focus solar radiation on the first side of the photovoltaic cell;
      an evaporative chamber coupled to the photovoltaic cell proximate the second side, the evaporative chamber configured to receive the coolant in the liquid phase to remove heat from the photovoltaic cell, and
      at least one coolant supply line configured to direct the coolant in the liquid state from the condenser to the evaporative cooling chamber, and at least one coolant return line configured to direct the coolant from the evaporative cooling chamber to the condenser wherein the condenser, the coolant supply line, the evaporative cooling chamber, and the coolant return line form a closed circulation system.

17. The system of claim 16, further comprising a platform coupled to the condenser and configured for use with a body of water, and wherein the condenser is at least partially submerged in the body of water.

18. The system of claim 16, further comprising a drive device configured to rotate the platform.

19. The system of claim 16, further comprising one or more floatation devices coupled to the platform.

20. A solar power generation system, comprising:
   a plurality of photovoltaic cells, each of the cells having a first side and a second side;
   at least one solar concentrator configured to focus solar radiation on the first side of the photovoltaic cell;
   a sealed evaporative cooling system, comprising:

an evaporative cooling chamber having one or more walls, at least one wall being configured to remove heat from the second side of the photovoltaic cell, the cooling chamber containing a coolant;
a condenser operable to receive the coolant in a vapor state and condense the coolant to a liquid state;
at least one coolant supply line configured to direct the coolant in the liquid state from the condenser to the evaporative cooling chamber; and
at least one coolant return line configured to direct the coolant in the vapor state from the evaporative cooling chamber to the condenser, wherein the condenser, the coolant supply line, the evaporative cooling chamber, and the coolant return line form a closed circulation system.

\* \* \* \* \*